(12) United States Patent
Ladhani et al.

(10) Patent No.: US 11,342,887 B2
(45) Date of Patent: May 24, 2022

(54) WIDEBAND RF POWER SPLITTERS AND AMPLIFIERS INCLUDING WIDEBAND RF POWER SPLITTERS

(71) Applicant: NXP USA, Inc., Austin, TX (US)

(72) Inventors: Hussain Hasanali Ladhani, Tempe, AZ (US); Elie A. Maalouf, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 322 days.

(21) Appl. No.: 16/718,459

(22) Filed: Dec. 18, 2019

(65) Prior Publication Data

US 2021/0194434 A1    Jun. 24, 2021

(51) Int. Cl.
*H03F 1/02* (2006.01)
*H03F 3/21* (2006.01)
(Continued)

(52) U.S. Cl.
CPC ....... *H03F 1/0288* (2013.01); *H01L 23/5383* (2013.01); *H01L 23/5386* (2013.01);
(Continued)

(58) Field of Classification Search
CPC ...................................................... H03F 1/02
See application file for complete search history.

(56) References Cited

U.S. PATENT DOCUMENTS 8,779,826 B1 *  7/2014  Chang ...................... G06G 7/12
                                                   327/306
9,270,007 B2    2/2016  Ju
(Continued)

FOREIGN PATENT DOCUMENTS

CN  102554675 A  7/2012
CN  103943930 A  7/2014
(Continued)

OTHER PUBLICATIONS

M. Heydari, et al.; "Miniaturised unequal Wilkinson power divider using lumped component elements"; Electronics Letters, vol. 53, No. 16; pp. 1117-1119 (Aug. 3, 2017).
(Continued)

*Primary Examiner* — Patricia T Nguyen
(74) *Attorney, Agent, or Firm* — Sherry Gourlay

(57) ABSTRACT

A power splitter for use in an amplifier (e.g., a Doherty amplifier) includes an input terminal, and first and second output terminals. The input terminal is configured to receive an input RF signal, the first output terminal is configured to produce a first RF output signal, and the second output terminal is configured to produce a second RF output signal. The power splitter also includes a first capacitance electrically coupled between the input terminal and the first output terminal, a second capacitance electrically coupled between the input terminal and the second output terminal, a first inductance electrically coupled between the input terminal and a ground reference node, a second inductance electrically coupled between the first output terminal and the ground reference node, a third inductance electrically coupled between the second output terminal and the ground reference node, and a resistance electrically coupled between the first and second output terminals.

15 Claims, 3 Drawing Sheets

(51) Int. Cl.
*H01L 25/16* (2006.01)
*H01L 23/66* (2006.01)
*H01L 23/538* (2006.01)
*H03H 7/48* (2006.01)
*H01L 21/48* (2006.01)
*H03H 3/00* (2006.01)
*H01L 23/00* (2006.01)

(52) U.S. Cl.
CPC .............. *H01L 23/66* (2013.01); *H01L 25/16* (2013.01); *H03F 3/211* (2013.01); *H03H 7/48* (2013.01); *H01L 21/4857* (2013.01); *H01L 24/48* (2013.01); *H01L 24/49* (2013.01); *H01L 24/85* (2013.01); *H01L 2223/6627* (2013.01); *H01L 2223/6644* (2013.01); *H01L 2224/48227* (2013.01); *H01L 2224/49175* (2013.01); *H03F 2200/451* (2013.01); *H03F 2203/21106* (2013.01); *H03H 3/00* (2013.01)

(56) References Cited

U.S. PATENT DOCUMENTS

| | | | | |
|---|---|---|---|---|
| 10,608,313 | B2* | 3/2020 | Wang | H01P 1/36 |
| 10,903,182 | B1* | 1/2021 | Wang | H03F 1/565 |
| 2010/0314048 | A1* | 12/2010 | Long | H01J 37/3211 |
| | | | | 156/345.48 |
| 2011/0210786 | A1* | 9/2011 | Blednov | H03F 3/195 |
| | | | | 330/124 R |
| 2014/0368294 | A1* | 12/2014 | Ju | H01P 5/16 |
| | | | | 333/125 |
| 2018/0226922 | A1* | 8/2018 | Hase | H03F 1/0211 |
| 2018/0269845 | A1* | 9/2018 | Arigong | H03H 7/18 |

FOREIGN PATENT DOCUMENTS

| | | |
|---|---|---|
| CN | 104022333 A | 9/2014 |
| CN | 104078736 A | 10/2014 |

OTHER PUBLICATIONS

T. Kawai, et al.; "Design Method of Lumped-Element Dual-Band Wilkinson Power Dividers Based on Frequency Transformation"; Proceedings of Asia-Pacific Microwave Conference 2010; pp. 710-713 (Sep. 2010).

T. Kawai, et al.; "Lumped-Element Quadrature Wilkinson Power Divider"; Proceedings of Asia-Pacific Microwave Conference 2009; pp. 1012-1015 (Dec. 2009).

H. Mizuno, et al.; "Unequal Wilkinson Power Dividers with In-/Reverse-Phase Using Lumped-Element Circuits"; Proceedings of the Asia-Pacific Microwave Conference 2008; pp. 1-4 (Dec. 2008).

Harvinder Nagi; "Miniature lumped element 180° Wilkinson Divider"; IEEE MTT-S International Microwave Symposium Digest; pp. 55-58 (Jun. 2003).

J. Staudinger, et al.; "An Octave Bandwidth 90° Coupler Topology Suitable for MMICs"; Microwave Journal; pp. 117-130 (Nov. 1990).

Y. Okada, et al.; "Design method of unequal Wilkinson power divider using LC-ladder circuits for multi-way power dividers"; Proceedings of the Asia-Pacific Microwave Conference 2016; pp. 1-4 (Dec. 2016).

Anaren; "Model C3337J5003AHF" data sheet; downloaded from https://cdn.anaren.com/product-documents/Xinger/ 90DegreeHybridCouplers/C3337J5003AHF/C3337J5003AHF_ Datasheet(Rev_H).pdf; pp. 1-6 (May 2019).

Kim, Cheol Ho et al; "Fully-Integrated Two-Stage GaN MMIC Doherty Power Amplifier for LTE Small Cells"; IEEE Microwave and Wireless Components Letters, vol. 26, No. 11; 3 pages (Nov. 2016).

* cited by examiner

WIDEBAND RF POWER SPLITTERS AND AMPLIFIERS INCLUDING WIDEBAND RF POWER SPLITTERS

TECHNICAL FIELD

Embodiments of the subject matter described herein relate generally to radio frequency (RF) power splitters for amplifiers, and more particularly to Doherty amplifiers and Doherty amplifier modules that include such RF power splitters.

BACKGROUND

Wireless communication systems employ power amplifiers for increasing the power of radio frequency (RF) signals. The power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

The Doherty power amplifier has been the focus of attention for base stations and other system components in wireless communication systems because of the amplifier's high power-added efficiency over a wide power dynamic range. An important sub-circuit for a Doherty power amplifier is an input RF power splitter. The input RF power splitter serves a critical function in the proper operation of the amplifier. In a two-way Doherty power amplifier that includes a main amplification path and a peaking amplification path, for example, the splitter divides the power of an RF signal to be amplified into a first RF signal to be amplified through the main amplification path, and a second RF signal to be amplified through the peaking amplification path. Desirably, a power splitter is capable of power splitting over a wide bandwidth, while also providing good matching at all its ports. Further, it is desirable for a power splitter to have a relatively-small phase dispersion over the required bandwidth, while maintain good isolation between the splitter's output ports. With the industry trend toward miniaturization of the Doherty power amplifier while increasing its bandwidth, it is becoming increasingly difficult to design input power splitters and Doherty power amplifiers that have all of the desired features listed above.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
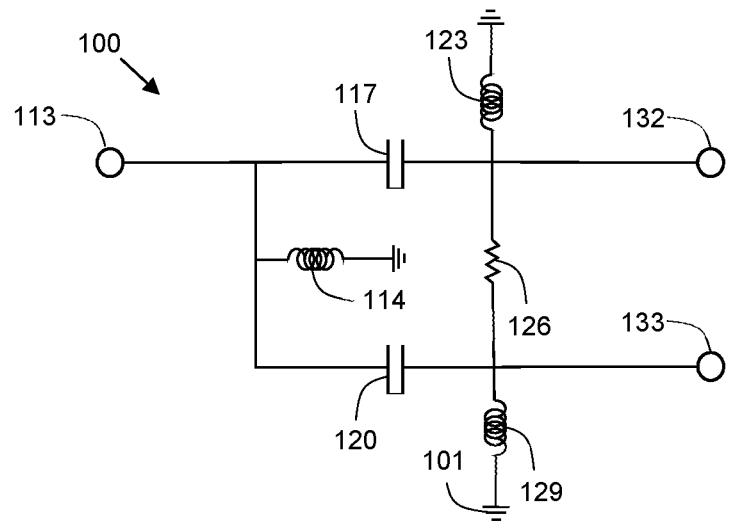
FIG. 1 is a schematic diagram of a power splitter, in accordance with an example embodiment.

Embodiments of the inventive subject matter include compact, broadband, input RF power splitters, which are suitable for use in Doherty power amplifiers and other types of power amplifiers. An embodiment of a power splitter includes an input terminal, and first and second output terminals. The input terminal is configured to receive an input RF signal, the first output terminal is configured to produce a first RF output signal, and the second output terminal is configured to produce a second RF output signal. The power splitter also includes a first capacitance electrically coupled between the input terminal and the first output terminal, a second capacitance electrically coupled between the input terminal and the second output terminal, a first inductance electrically coupled between the input terminal and a ground reference node, a second inductance electrically coupled between the first output terminal and the ground reference node, a third inductance electrically coupled between the second output terminal and the ground reference node, and a resistance electrically coupled between the first and second output terminals.

In a further embodiment, the first capacitance is directly coupled, without additional intervening electrical components, to the input terminal and the first output terminal, the second capacitance is directly coupled, without additional intervening electrical components, to the input terminal and the second output terminal, the first inductance is directly coupled, without additional intervening electrical components, to the input terminal and the ground reference node, the second inductance is directly coupled, without additional intervening electrical components, to the first output terminal and the ground reference node, the third inductance is directly coupled, without additional intervening electrical components, to the second output terminal and the ground reference node, and the resistance is directly coupled, without additional intervening electrical components, to the first and second output terminals. In another further embodiment, the first and second capacitance, the first, second, and third inductance, and the resistance are discrete, surface mount components. In yet another further embodiment, the substrate is selected from a printed circuit board, a semiconductor substrate, and a ceramic substrate.

An embodiment of an RF power amplifier module includes a module substrate, a signal splitter, and first and second power transistor dies. The module substrate has a mounting surface, and a plurality of non-overlapping zones is defined at the mounting surface. The signal splitter is coupled to the mounting surface in a first zone of the plurality of non-overlapping zones. The signal splitter includes a splitter input terminal configured to receive an input RF signal, a first splitter output terminal configured to produce a first RF output signal, and a second splitter output terminal configured to produce a second RF output signal. The signal splitter also includes a first capacitance electrically coupled between the splitter input terminal and the first splitter output terminal, a second capacitance electrically coupled between the splitter input terminal and the second splitter output terminal, a first inductance electrically coupled between the splitter input terminal and a ground reference node, a second inductance electrically coupled between the first splitter output terminal and the ground reference node, a third inductance electrically coupled between the second splitter output terminal and the ground reference node, and a resistance electrically coupled between the first and second splitter output terminals. The first power transistor die is coupled to the mounting surface in a second zone of the plurality of non-overlapping zones, and the first power transistor die includes a first transistor integrated within the first power transistor die, where an input terminal of the first power transistor die is electrically coupled to the first splitter output terminal. The second power transistor die is coupled to the mounting surface in a third zone of the plurality of non-overlapping zones, and the second power transistor die includes a second transistor integrated within the second power transistor die, where an input terminal of the second power transistor die is electrically coupled to the second splitter output terminal.

According to a further embodiment, the first capacitance is directly coupled, without additional intervening electrical components, to the splitter input terminal and the first splitter output terminal, the second capacitance is directly coupled, without additional intervening electrical components, to the splitter input terminal and the second splitter output terminal, the first inductance is directly coupled, without additional intervening electrical components, to the splitter input terminal and the ground reference node, the second inductance is directly coupled, without additional intervening electrical components, to the first splitter output terminal and the ground reference node, the third inductance is directly coupled, without additional intervening electrical components, to the second splitter output terminal and the ground reference node, and the resistance is directly coupled, without additional intervening electrical components, to the first and second splitter output terminals. According to another further embodiment, the first and second capacitance, the first, second, and third inductance, and the resistance are discrete, surface mount components that are directly connected to bond pads at the mounting surface of the module substrate. According to yet another further embodiment, the signal splitter further includes a splitter substrate that is distinct from the module substrate, where the first and second capacitance, the first, second, and third inductance, and the resistance are discrete, surface mount components that are directly connected to bond pads at a surface of the splitter substrate, and the splitter substrate is coupled to the mounting surface of the module substrate. According to yet another further embodiment, the RF power amplifier module further includes an input circuit electrically coupled between the second splitter output terminal and the input terminal of the second power transistor die, where the input circuit is configured to impart a 90-degree phase shift to the second RF output signal provided at the second splitter output terminal. According to yet another further embodiment, the RF power amplifier module further includes a first transmission line coupled to the substrate and located within a fourth zone of the plurality of non-overlapping zones, where a first end of the first transmission line is coupled to an output terminal of the first power transistor die, and a second end of the first transmission line is coupled to an output terminal of the second power transistor die. According to yet another further embodiment, the RF power amplifier module further includes a second transmission line coupled to the substrate and located within a fifth zone of the plurality of non-overlapping zones, where the second transmission line is coupled to the output terminal of the second power transistor die. According to yet another further embodiment, the first power transistor die is a main amplifier die of a Doherty power amplifier, and the second power transistor die is a peaking amplifier die of a Doherty power amplifier.

An embodiment of a Doherty amplifier includes a signal splitter, a main amplifier, and a peaking amplifier. The signal splitter includes a splitter input terminal configured to receive an input RF signal, a first splitter output terminal configured to produce a first RF output signal, and a second splitter output terminal configured to produce a second RF output signal. The signal splitter also includes a first capacitance electrically coupled between the splitter input terminal and the first splitter output terminal, a second capacitance electrically coupled between the splitter input terminal and the second splitter output terminal, a first inductance electrically coupled between the splitter input terminal and a ground reference node, a second inductance electrically coupled between the first splitter output terminal and the ground reference node, a third inductance electrically coupled between the second splitter output terminal and the ground reference node, and a resistance electrically coupled between the first and second splitter output terminals. The main amplifier includes a main amplifier input terminal and a main amplifier output terminal, and the main amplifier input terminal is electrically coupled to the first splitter output terminal. The peaking amplifier includes a peaking amplifier input terminal and a peaking amplifier output terminal, and the peaking amplifier input terminal is electrically coupled to the second splitter output terminal.

According to a further embodiment, the first capacitance is directly coupled, without additional intervening electrical components, to the splitter input terminal and the first splitter output terminal, the second capacitance is directly coupled, without additional intervening electrical components, to the splitter input terminal and the second splitter output terminal, the first inductance is directly coupled, without additional intervening electrical components, to the splitter input terminal and the ground reference node, the second inductance is directly coupled, without additional intervening electrical components, to the first splitter output terminal and the ground reference node, the third inductance is directly coupled, without additional intervening electrical components, to the second splitter output terminal and the ground reference node, and the resistance is directly coupled, without additional intervening electrical components, to the first and second splitter output terminals. According to another further embodiment, the first and second capacitance, the first, second, and third inductance, and the resistance are discrete, surface mount components. According to yet another further embodiment, the Doherty amplifier further includes an input circuit electrically coupled between the second splitter output terminal and the peaking amplifier input terminal, where the input circuit is configured to impart a 90-degree phase shift to the second RF output signal provided at the second splitter output terminal. According to yet another further embodiment, the Doherty amplifier further includes a phase shift and impedance inversion structure connected between the first drain terminal and the second drain terminal, where the phase shift and impedance inversion structure includes a transmission line with a first end coupled to the main amplifier output terminal, and a second end coupled to the peaking amplifier output terminal.

FIG. 1 is a schematic diagram of a power splitter 100, in accordance with an example embodiment. Power splitter 100 has an input terminal 113 (or input port) and first and second output terminals 132, 133 (or a direct port and a coupled port). A first capacitance 117 has a first terminal coupled, without intervening elements (i.e., directly coupled without additional electrical components), to the input terminal 113, and a second terminal coupled, without intervening elements, to the first output terminal 132. A second capacitance 120 has a first terminal coupled, without intervening elements, to the input terminal 113, and a second terminal coupled, without intervening elements, to the second output terminal 133. A first shunt inductance 114 has a first terminal coupled, without intervening elements, to the input terminal 113, and a second terminal coupled, without intervening elements, to a ground reference node 101. A second shunt inductance 123 has a first terminal coupled, without intervening elements, to the first output terminal 132, and a second terminal coupled, without intervening elements, to the ground reference node 101. A third shunt inductance 129 has a first terminal coupled, without intervening elements, to the second output terminal 133, and a second terminal coupled, without intervening elements, to the ground reference node 101. Finally, a resistance 126 has a first terminal coupled, without intervening elements, to the first output terminal 132, and a second terminal coupled, without intervening elements, to the second output terminal 133.

Although each of the capacitances 117, 120, inductances 114, 123, 129, and resistance 126 are shown as a singular component in FIG. 1, each component actually may be implemented using a network of one or more components of the same type. For example, although each capacitance 117, 120 could be implemented using a single physical component (e.g., discrete capacitors 217, 220, FIG. 2), each capacitance 117, 120 alternatively could be implemented using a network of series-coupled and/or parallel-coupled capacitors. Similarly, although each inductance 114, 123, 129 could be implemented using a single physical component (e.g., discrete inductors 214, 223, 229, FIG. 2), each inductance 114, 123, 129 alternatively could be implemented using a network of series-coupled and/or parallel-coupled inductors. Finally, although resistor 126 could be implemented using a single physical component (e.g., discrete resistor 226, FIG. 2), resistor 126 alternatively could be implemented using a network of series-coupled and/or parallel-coupled resistors.

Figure 2:
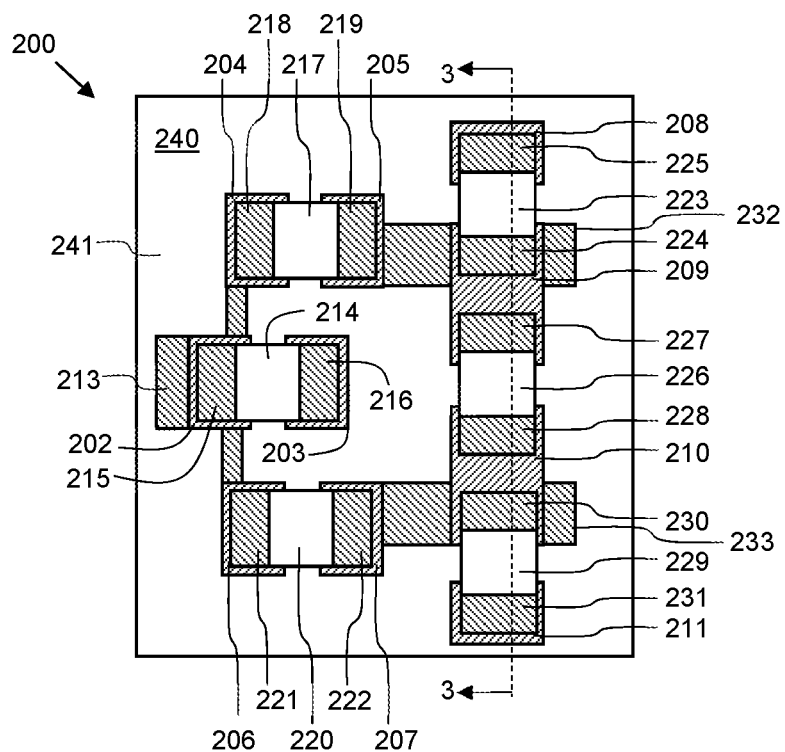
FIG. 2 is a top view of a power splitter implemented using discrete, surface mount devices, in accordance with an example embodiment.

A physical implementation of the power splitter 100 of FIG. 1 will now be described in conjunction with FIG. 2, which is a top view of a power splitter 200. Power splitter 200 has the same electrical configuration as power splitter 100 (FIG. 1), and is implemented using discrete, surface mount, passive components 214, 217, 220, 223, 226, 229, in accordance with an example embodiment. FIG. 2 should be viewed simultaneously with FIG. 3, which is a cross-sectional, side view of the power splitter 200 of FIG. 2 along line 3-3. As is indicated in FIG. 2, power splitter 100 has a particularly compact configuration, which is suitable for use in very small amplifiers (e.g., in Doherty amplifier module 400, FIG. 4).

Figure 3:
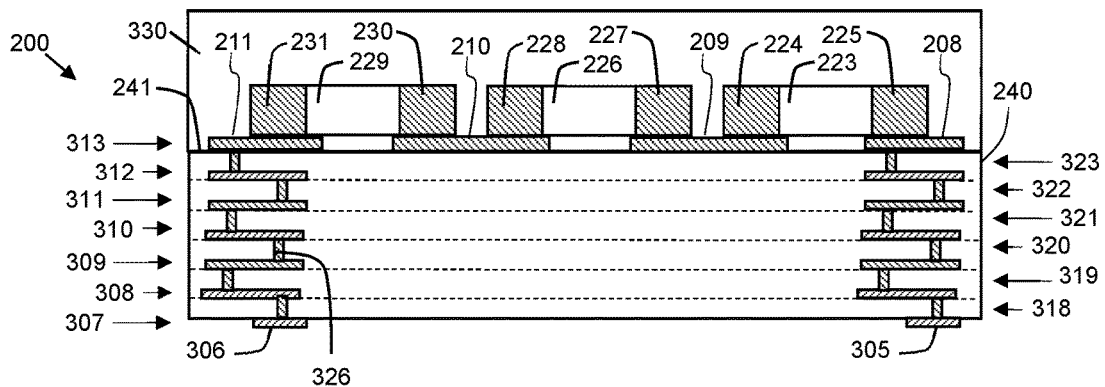
FIG. 3 is a cross-sectional, side view of the power splitter of FIG. 2 along line 3-3.
Figure 4:
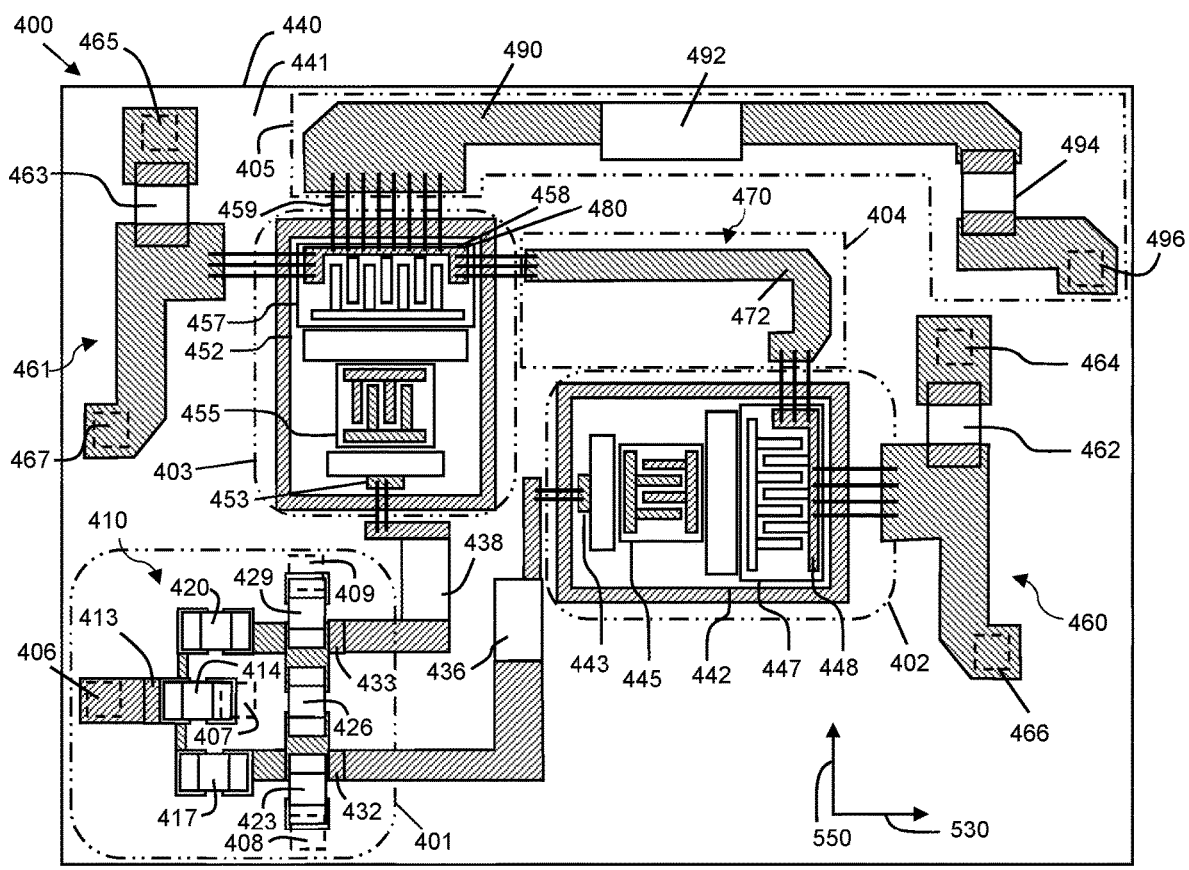
FIG. 4 is a top view of a Doherty amplifier module that includes the power splitter of FIG. 2, in accordance with an example embodiment.

Power splitter 200 is implemented on a substrate 240 (e.g., substrate 440, FIG. 4). As best illustrated in FIG. 3, the substrate 240 may be a multi-layer printed circuit board (PCB), which includes a bottom patterned conductive layer 307, a top patterned conductive layer 313, and a plurality of interior patterned conductive layers 308, 309, 310, 311, 312, which are separated by a plurality of dielectric layers 318, 319, 320, 321, 322, 323. Portions of adjacent conductive layers 308-313 and the bottom conductive layer 307 may be electrically connected to each other with conductive vias (e.g., via 326). Although the illustrated embodiment includes five interior conductive layers 308-312, alternate embodiments may include more or fewer interior conductive layers, including as few as zero interior conductive layers. Further, although substrate 240 is described as a PCB substrate herein, in other embodiments, substrate 240 may be a semiconductor substrate (e.g., power splitter 200 may form a portion of an integrated passive device (IPD) or an integrated active device (IAD)), a ceramic substrate (e.g., low temperature co-fired ceramic), or another suitable type of substrate. When substrate 240 is implemented as a semiconductor substrate, for example, some or all of surface mount components 214, 217, 220, 223, 226, 229 may be implemented as (i.e., replaced with) integrated or other types of components. For example, one or more of inductors 214, 223, 229 may be integrated spiral inductors or wirebond arrays, either or both of capacitors 117, 120 may be implemented as integrated metal-insulator-metal (MIM) capacitors, and/or resistor 226 may be implemented as an integrated resistor.

The top conductive layer 313 is patterned to provide a plurality of bond pads 202-211 at the top surface 241 of the substrate 240. As best illustrated in FIG. 3, at least some of the bond pads (e.g., bond pads 203, 208, 211) are electrically connected through the substrate 240 to pads 305, 306 (e.g., lands) formed from portions of the bottom conductive layer 307 to enable those bond pads to be electrically connected to system ground. In other embodiments, the bond pads 203, 208, 211 may be electrically connected to system ground in a different manner.

Power splitter 200 has an input terminal 213 (e.g., input terminal 113, FIG. 1, also referred to as an input port) and first and second output terminals 232, 233 (e.g., output terminals 132, 133, FIG. 1, also referred to as a direct port and a coupled port, respectively). Further, power splitter 200 includes a plurality of discrete, surface-mount, passive components 214, 217, 220, 223, 226, 229 that are physically and electrically connected to the various bond pads 202-211, as will be described in more detail below. The physical and electrical connections between components 214, 217, 220, 223, 226, 229 and bond pads 202-211 may be made with solder, conductive adhesive, sintering, or using other techniques.

The input terminal 213 is electrically connected to bond pad 202. A first surface-mount inductor 214 (e.g., inductance 114, FIG. 1) has a first terminal 215 electrically connected to bond pad 202, and a second terminal 216 electrically connected to bond pad 203. Bond pad 203 is electrically connected through the substrate 240 to a pad (not shown) formed from a portion of bottom conductive layer 307 (e.g., which may be connected to a ground reference node 101).

A first surface-mount capacitor 217 (e.g., capacitance 117, FIG. 1) has a first terminal 218 electrically connected to bond pad 204, and a second terminal 219 electrically connected to bond pad 205. Bond pad 204 is electrically connected to the input terminal 213, and bond pad 205 is electrically connected to the first output terminal 232. A second surface-mount capacitor 220 (e.g., capacitance 120, FIG. 1) has a first terminal 221 electrically connected to bond pad 206, and a second terminal 222 electrically connected to bond pad 207. Bond pad 206 is electrically connected to the input terminal 213, and bond pad 207 is electrically connected to the second output terminal 233.

A second surface-mount inductor 223 (e.g., inductance 123, FIG. 1) has a first terminal 224 electrically connected to bond pad 209, and a second terminal 225 electrically connected to bond pad 208. Bond pad 209 is electrically connected to the first output terminal 232, and as shown in FIG. 3, bond pad 208 is electrically connected through the substrate 240 to a pad 305 (or land) formed from a portion of the bottom conductive layer 307 (e.g., which may be connected to a ground reference node 101).

A third surface-mount inductor 229 (e.g., inductance 129, FIG. 1) has a first terminal 230 electrically connected to bond pad 210, and a second terminal 231 electrically connected to bond pad 211. Bond pad 210 is electrically connected to the second output terminal 233, and as shown in FIG. 3, bond pad 211 is electrically connected through the substrate 240 to a pad 306 (or land) formed from a portion of the bottom conductive layer 307 (e.g., which may be connected to a ground reference node 101).

A surface-mount resistor 226 (e.g., resistance 126, FIG. 1) has a first terminal 227 electrically connected to bond pad 209 (and thus to output terminal 232), and a second terminal 228 electrically connected to bond pad 210 (and thus to output terminal 233).

Power splitters 100, 200 have a high-pass topology, which may reduce amplifier low frequency gain peaks, in an embodiment. According to an embodiment, power splitters 100, 200 are configured to divide the power of an input RF signal that has a fundamental frequency in a desired frequency range by selecting suitable component values for that frequency range. For example, the component values may be selected for any sub-frequency range within an overall range of about 800 megahertz (MHz) to about 6 gigahertz (GHz), although power splitters 100, 200 could be configured to divide the power of input RF signals at lower or higher frequencies, as well. For example, example component values listed below may be suitable in versions of power splitters 100, 200 that are configured to divide the power of an input RF signal with a fundamental frequency in a range of about 3 GHz to about 4 GHz. Further, the component values for power splitters 100, 200 are selected to have good isolation between its output ports (i.e., isolation of at least −10 decibels (dB) between output terminals 132, 133, 232, 233), and to enable wideband operation (e.g., an operational RF bandwidth in a range of up to 1 GHz or more) at the fundamental frequency without significantly distorting the RF input signal over the signal bandwidth. In some embodiments, power splitters 100, 200 are configured to divide the power of the input RF signal at input terminal 113, 213 into equal-power output RF signals at output terminals 132, 133, 232, 233 (i.e., the power of the first output RF signal produced at output terminal 132, 232 is substantially equal to the power of the second output RF signal produced at output terminal 133, 233). This may be particularly advantageous, for example, when power splitter 100, 200 is used in a symmetric Doherty amplifier (e.g., an embodiment of Doherty amplifier 400 in which the main and peaking amplifiers are substantially the same size).

In other embodiments, power splitters 100, 200 are configured to divide the power of the input RF signal at input terminal 113, 213 into unequal-power output RF signals at output terminals 132, 133, 232, 233 (i.e., the power of the first output RF signal produced at output terminal 132, 232 is not equal to the power of the second output RF signal produced at output terminal 133, 233). This may be particularly advantageous, for example, when power splitter 100, 200 is used in an asymmetric Doherty amplifier (e.g., an embodiment of Doherty amplifier 400 in which the main and peaking amplifiers are of substantially different sizes). For example, an asymmetric Doherty amplifier may have a peaking amplifier that is significantly larger than the main amplifier, and the power of the RF signal provided to the peaking amplifier should be proportionally larger than the power of the RF signal provided to the main amplifier. As a more specific example, when the peaking amplifier is about twice the size of the main amplifier, the power of the peaking RF signal should be about twice the power of the main RF signal. Thus, assuming that output terminal 132, 232 is coupled to the main amplifier, and output terminal 133, 233 is coupled to the peaking amplifier, power splitters 100, 200 would be configured so that about one third of the power of the input RF signal at input terminal 113, 213 is provided to the first output terminal 132, 232, and about two thirds of the power of the input RF signal at input terminal 113, 213 is provided to the second output terminal 133, 233.

Example component values for symmetric and asymmetric embodiments of power splitter 100, 200 configured for operation in an example frequency range are provided below. Those of skill in the art would understand, based on the description herein, that the component values may be different for embodiments of power splitter 100, 200 that are configured for operation in frequency ranges other than the below-specified, example frequency range. In a "symmetric" embodiment in which power splitter 100, 200 is configured to divide an input RF signal having a fundamental frequency between 3 GHz and 4 GHz into equal-power output RF signals:

capacitance/capacitor 117, 217 may have a capacitance value in a range of about 0.6 picofarads (pF) to about 0.8 pF;
capacitance/capacitor 120, 220 may have a capacitance value in a range of about 0.6 pF to about 0.8 pF;
inductance/inductor 114, 214 may have an inductance value in a range of about 1.8 nanohenries (nH) to about 1.9 nH;
inductance/inductor 123, 223 may have an inductance value in a range of about 5 nH to about 6 nH;
inductance/inductor 129, 229 may have an inductance value in a range of about 5 nH to about 6 nH; and
resistance/resistor 126, 226 may have a resistance value in a range of about 90 Ohms to about 110 Ohms.

In an "asymmetric" embodiment in which power splitter 100, 200 is configured to divide an input RF signal having a fundamental frequency between 3 GHz and 4 GHz into unequal-power output signals that include a first output RF signal with about one third the input signal RF power at output terminal 132, 232 and with about two thirds the input signal RF power at output terminal 133, 233:

capacitance/capacitor 117, 217 may have a capacitance value in a range of about 0.3 pF to about 0.5 pF;
capacitance/capacitor 120, 220 may have a capacitance value in a range of about 0.7 pF to about 0.9 pF;
inductance/inductor 114, 214 may have an inductance value in a range of about 3 nH to about 4 nH;
inductance/inductor 123, 223 may have an inductance value in a range of about 8 nH to about 9 nH;
inductance/inductor 129, 229 may have an inductance value in a range of about 4 nH to about 5 nH; and
resistance/resistor 126, 226 may have a resistance value in a range of about 90 Ohms to about 110 Ohms.

The above-described power splitters 100, 200 may be incorporated into a variety of different types of power amplifiers to provide compact implementations of a broadband, input RF power splitter with good port-to-port isolation. For example, the above described power splitters 100, 200 may be incorporated in a Doherty power amplifier, although utilization of the power splitters 100, 200 is not limited to Doherty power amplifiers.

FIG. 4 is a top view of a Doherty amplifier module 400 that includes the power splitter of FIG. 2 (having the circuit configuration of FIG. 1), in accordance with an example embodiment. Doherty amplifier module 400 includes a substrate 440 (e.g., substrate 240, FIG. 2), power splitter 410 (e.g., power splitter 100, 200, FIGS. 1, 2), a main amplifier die 442, a peaking amplifier die 452, a phase shift and impedance inversion structure 470, a first shunt impedance circuit 460 coupled to the main amplifier die 442, a second shunt impedance circuit 461 coupled to the peaking amplifier die 452, and various other circuit elements, which will be discussed in more detail below.

The Doherty amplifier module 400 may be implemented as a land grid array (LGA) module, for example. Accordingly, the substrate 440 has a component mounting surface 441 (also referred to herein as an "upper" or "top" surface) and an opposed land surface (also referred to herein as a "lower" or "bottom" surface). Conductive landing pads 406-409, 464-467, 496 of the LGA are exposed at the land surface, and the locations of some example landing pads 406-409, 464-467, 496 are indicated with dashed boxes in FIG. 4. Although module 400 is depicted as an LGA module, module 400 alternatively may be packaged as a pin grid array module, a quad flat no leads (QFN) module, or another type of package. Either way, the component mounting surface 441 and the components mounted to that surface 441 optionally may be covered with an encapsulant material (e.g., a plastic encapsulant). In an alternate embodiment, the components could be contained within an air cavity, which is defined by various structures (not illustrated) overlying the mounting surface 441.

According to an embodiment, the substrate 440 is relatively small, which provides for a particularly compact Doherty amplifier. For example, the component mounting surface 441 may have a width (horizontal dimension in FIG. 4) and a length (vertical dimension in FIG. 4) in a range of about 5 millimeters (mm) to about 20 mm, although the width and/or length may be smaller or larger, as well. In a particular embodiment, for example, the component mounting surface may have a width of about 10 mm and a length of about 6 mm.

A plurality of non-overlapping zones is defined at the mounting surface 441 of the substrate 440, where each zone includes the portion of the substrate 440 within the indicated zone boundaries (indicated with dashed-dotted lines) and between the mounting surface 441 and the land surface. More specifically, the non-overlapping zones include an input splitter zone 401, a first-die mounting zone 402, a second-die mounting zone 403, an inter-amplifier impedance inverter zone 404 (referred to herein as an "inverter zone"), and an output match zone 405.

Within the splitter zone 401, a conductive landing pad 406 exposed at the land surface is electrically coupled through the substrate 440 to a conductive contact at the mounting surface 441. The landing pad 406 and the contact, along with the electrical connections between them, function as the RF input terminal for the module 400.

The power splitter 410 may have the circuit configuration of the splitter 100 of FIG. 1, and more particularly the physical implementation of the splitter 200 of FIG. 2. The power splitter 410 is configured to split the power of the input RF signal received through the RF input terminal (e.g., landing pad 406) into first and second RF signals (e.g., main and peaking signals). The components of the power splitter 410 are coupled to the mounting surface 441 in the input signal zone 401.

According to an embodiment, the power splitter 410 includes an input terminal 413 (e.g., input terminal 113, 213, FIGS. 1, 2) and first and second output terminals 432, 433 (e.g., output terminals 132, 133, 232, 233, FIGS. 1, 2). Further, power splitter 410 includes a plurality of discrete, surface-mount, passive components 414, 417, 420, 423, 426, 429 (e.g., components 214, 217, 220, 223, 226, 229, FIG. 2) that are physically and electrically connected to various bond pads (e.g., bond pads 202-211, FIG. 2). The physical and electrical connections between components 414, 417, 420, 423, 426, 429 and the bond pads may be made with solder, conductive adhesive, sintering, or using other techniques.

The input terminal 413 is electrically connected to the conductive landing pad 406, and thus to the RF input terminal for the module 400. A first surface-mount inductor 414 (e.g., inductance/inductor 114, 214, FIGS. 1, 2) has a first terminal electrically connected to a first bond pad (e.g., bond pad 202, FIG. 2) and the input terminal 413, and a second terminal electrically connected to a second bond pad (e.g., bond pad 203, FIG. 2), which in turn is electrically connected through the substrate 440 to a landing pad 407 (e.g., which may be connected to a ground reference node 101).

A first surface-mount capacitor 417 (e.g., capacitance/capacitor 117, 217, FIGS. 1, 2) has a first terminal electrically connected to a third bond pad (e.g., bond pad 204, FIG. 2) and the input terminal 413, and a second terminal electrically connected to a fourth bond pad (e.g., bond pad 205, FIG. 2), which in turn is electrically connected to the first output terminal 432 (e.g., output terminal 132, 232, FIGS. 1, 2). A second surface-mount capacitor 420 (e.g., capacitance/capacitor 120, 220, FIGS. 1, 2) has a first terminal electrically connected to a fifth bond pad (e.g., bond pad 206, FIG. 2) and the input terminal 413, and a second terminal electrically connected to a sixth bond pad (e.g., bond pad 207, FIG. 2), which in turn is electrically connected to the second output terminal 433 (e.g., output terminal 133, 233, FIGS. 1, 2).

A second surface-mount inductor 423 (e.g., inductance/inductor 123, 223, FIGS. 1, 2) has a first terminal electrically connected to a seventh bond pad (e.g., bond pad 209, FIG. 2), and a second terminal electrically connected to an eighth bond pad (e.g., bond pad 208, FIG. 2), which in turn is electrically connected through the substrate 440 to a landing pad 408 (e.g., which may be connected to a ground reference node 101).

A third surface-mount inductor 429 (e.g., inductance/inductor 129, 229, FIGS. 1, 2) has a first terminal electrically connected to a ninth bond pad (e.g., bond pad 210, FIG. 2), and a second terminal electrically connected to a tenth bond pad (e.g., bond pad 211, FIG. 2, which in turn is electrically connected through the substrate 440 to a landing pad 409 (e.g., which may be connected to a ground reference node 101).

Finally, a surface-mount resistor 426 (e.g., resistance/resistor 126, 226, FIGS. 1, 2) has a first terminal electrically connected to the seventh bond pad (e.g., bond pad 209, FIG. 2) and to output terminal 432, and a second terminal electrically connected to the ninth bond pad (e.g., bond pad 210, FIG. 2) and to output terminal 433.

The first and second RF signals (i.e., the main and peaking signals) are produced at output terminals 432, 433, respectively. The first and second RF signals may have equal or unequal power, as discussed previously. The first RF signal produced at output terminal 432 is amplified through a main amplifier path, and the second RF signal produced at output terminal 433 is amplified through a peaking amplifier path. The main amplifier path includes an input circuit 436, a main amplifier die 442 mounted within the first-die mounting zone 402, and a phase shift and impedance inversion structure 470. The phase shift and impedance inversion structure 470 includes a series combination of an inverter line 472 connected to the substrate 440 within the inverter zone 404, and wirebond arrays (not numbered) that electrically connect the inverter line 472 to the outputs of dies 442, 452.

An input end of the input circuit 436 is electrically connected to the first output 432 of the signal splitter 410. Although the detail is not shown in FIG. 4, the input circuit 436 may include a plurality of discrete and/or integrated components (e.g., inductors and capacitors) configured to provide proper impedance matching between the first power splitter output 432 and the input to the main amplifier die 442.

An output end of the input circuit 436 is electrically coupled (e.g., with wirebonds, not numbered) to an RF input terminal 443 of the main amplifier die 442, in order to provide the RF main signal for amplification to the main amplifier die 442. The illustrated embodiment of main amplifier die 442 embodies a two-stage amplifier. More specifically, the electrical components of main amplifier die 442 include the RF input terminal 443, an input matching network (not numbered), a driver stage transistor 445, an interstage matching network (not numbered), an output or final-stage transistor 447, and an RF output terminal 448. The driver and output transistors 445, 447 are coupled in series between the input and output terminals 443, 448. The driver transistor 445 is configured to apply gain to the main signal, and the output transistor 447 is configured to deliver the required power to the main signal after preliminary amplification by the driver transistor 445. In other embodiments, the main amplifier die 442 may embody a single stage amplifier, or may include more than two amplification stages.

Each of the transistors 445, 447 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 445, 447 may be a bipolar junction transistor (BJT). References herein to a "gate," "drain," and "source," which are commonly used to describe FETs, are not intended to be limiting, as each of these designations has analogous features for BJT implementations. In various embodiments, the semiconductor substrates on which transistors 445, 447 are formed may comprise silicon, silicon-on-insulator (SOI), silicon-on-sapphire (SOS), gallium arsenide (GaAs), gallium nitride (GaN), GaN on silicon carbide, GaN on silicon, or other types of substrate materials. Although transistors 445, 447 are shown to be monolithically formed in main amplifier die 442, in an alternate embodiment, transistors 445, 447 may be integrally formed in different and distinct semiconductor dies. In such an embodiment, the semiconductor technology used for the driver stage transistor 445 may be the same as or different from the semiconductor technology used for the final stage transistor 447 (e.g., the driver stage transistor 445 may be implemented on a silicon semiconductor substrate, and the final stage transistor 447 may be implemented on a gallium nitride (GaN) or other III-V semiconductor substrate).

The input terminal 443 of die 442 is electrically coupled to the gate terminal of transistor 445 through the input matching network, and the drain terminal of transistor 445 is electrically coupled to the gate terminal of transistor 447 through the inter-stage matching network. The drain terminal of transistor 447 is electrically coupled to output terminal 448. Accordingly, the signal path through the main amplifier die 442 is in a direction extending from the RF input terminal 443 toward the RF output terminal 448, which direction is indicated by arrow 530. An amplified RF main signal is produced by the main amplifier die 442 at the RF output terminal 448.

A shunt inductance circuit 460 may be connected to the output terminal 448 of the main amplifier die 442. More particularly, the RF output terminal 448 may be electrically coupled through a first shunt inductance circuit 460 to a landing pad 464. When integrated with a larger RF system, landing pad 464 may be connected to system ground. The first shunt inductance circuit 460 includes an inductive element in the form of a set of wirebonds (not numbered) and a capacitor 462, where the inductive element and the capacitor 462 are connected in series between the RF output terminal 448 and the landing pad 464. According to an embodiment, the wirebonds are configured to provide an inductance that is sufficient to resonate out at least some of the drain-source capacitance of transistor 447. The shunt capacitor 462 has a capacitance value that is chosen to provide a virtual ground reference voltage for the RF electrical signals, such that the wirebonds function as a shunt inductance to the RF ground voltage. Desirably, the shunt capacitor 462 is series resonant in band.

The conductive trace to which the wirebonds and capacitor 462 are coupled corresponds to an RF cold point node, and accordingly the trace may be used to provide a DC bias voltage to the drain of the final-stage transistor 447 through output terminal 448. Accordingly, in an embodiment, the trace also may be coupled through the substrate 440 to landing pad 466. Landing pad 466, in turn, may be coupled to a drain bias circuit in the RF system to which module 400 ultimately is connected.

In an embodiment, the RF output terminal 448 is electrically coupled, through a first wirebond array (not numbered), to a first end of inverter line 472 (i.e., a transmission line), which is coupled to the substrate 440 and is at least partially exposed at the mounting surface 441, in an embodiment. According to an embodiment, the RF output terminal 448 of main amplifier die 442 includes an elongated first pad that is configured to enable the wirebonds to be connected to the inverter line 472 so that the wirebonds extend in a direction that is angularly offset from (e.g., perpendicular to) the direction of the signal path through the main amplifier die 442 (e.g., the wirebonds may extend in the direction indicated by arrow 550). Further, the RF output terminal 448 may include an elongated second pad that is configured to enable the wirebonds corresponding to the inductive element of the shunt inductance circuit 460 to be connected to the second pad so that those wirebonds extend in a direction that is substantially parallel to the direction of the signal path through the main amplifier die 442 (i.e., the wirebonds may extend in the direction indicated by arrow 530).

As mentioned above, through a wirebond array, the RF output terminal 448 is electrically coupled to inverter line 472, which is located in the inverter zone 404. According to an embodiment, inverter line 472 is implemented with a transmission line (e.g., a microstrip line) having an electrical length of less than lambda/4 ($\lambda/4$), where lambda corresponds to the wavelength of a center frequency within a bandwidth of operation of the module 400. The inverter line 472 has a first end that is proximate to the main amplifier die 442 (and more particularly within a wirebond length of the RF output terminal 448), and a second end that is proximate to the peaking amplifier die 452 (and more particularly within a wirebond length of the RF output terminal 458 of the peaking amplifier die 452).

Moving back to the power splitter 410 in the splitter zone 401, the second RF signal (i.e., the peaking signal) produced at output terminal 433 of the power splitter 410 is amplified through a peaking amplifier path. The peaking amplifier path includes input circuit 438, and a peaking amplifier die 452 mounted within the second-die mounting zone 403.

An input end of the input circuit 438 is electrically connected to the second output 433 of the signal splitter 410. Although the detail is not shown in FIG. 4, the input circuit 438 may include a plurality of discrete and/or integrated components (e.g., inductors and capacitors) configured to provide proper impedance matching between the second power splitter output 433 and the input to the peaking amplifier die 452. In addition, according to an embodiment, the input circuit 438 of the peaking amplifier path may be configured to impart about a 90-degree phase shift to the RF signal provided at output terminal 433. Accordingly, the phase of the peaking signal received at input terminal 453 of peaking die 452 is delayed by about 90 degrees with respect to the phase of the main signal received at input terminal 443 of main die 442.

An output end of the input circuit 438 is electrically coupled (e.g., with wirebonds, not numbered) to an RF input terminal 453 of the peaking amplifier die 452, in order to provide the RF peaking signal for amplification to the peaking amplifier die 452. The illustrated embodiment of peaking amplifier die 452 embodies a two-stage amplifier. More specifically, the electrical components of peaking amplifier die 452 include the RF input terminal 453, an input matching network (not numbered), a driver stage transistor 455, an interstage matching network (not numbered), an output or final-stage transistor 457, and an RF output terminal 458. The driver and output transistors 455, 457 are coupled in series between the input and output terminals 453, 458. The driver transistor 455 is configured to apply gain to the peaking signal, and the output transistor 457 is configured to deliver the required power to the peaking signal after preliminary amplification by the driver transistor 455. In other embodiments, the peaking amplifier die 452 may embody a single stage amplifier, or may include more than two amplification stages.

Each of the transistors 455, 457 may be a FET. Alternatively, each of the transistors 455, 457 may be a BJT. Although transistors 455, 457 are shown to be monolithically formed in peaking amplifier die 452, in an alternate embodiment, transistors 455, 457 may be integrally formed in different and distinct semiconductor dies. In such an embodiment, the semiconductor technology used for the driver stage transistor 455 may be the same as or different from the semiconductor technology used for the final stage transistor 457 (e.g., the driver stage transistor 455 may be implemented on a silicon semiconductor substrate, and the final stage transistor 457 may be implemented on a GaN or other III-V semiconductor substrate).

The input terminal 453 of die 452 is electrically coupled to the gate terminal of transistor 455 through the input matching network, and the drain terminal of transistor 455 is electrically coupled to the gate terminal of transistor 457 through the inter-stage matching network. The drain terminal of transistor 457 is electrically coupled to output terminal 458. Accordingly, the signal path through the peaking amplifier die 452 is in a direction extending from the RF input terminal 453 toward the RF output terminal 458, which direction is indicated by arrow 550. An amplified RF peaking signal is produced by the peaking amplifier die 452 at the RF output terminal 458.

The signal path through the peaking amplifier die 452 is in a direction extending from the RF input terminal 453 to the RF output terminal 458, which direction is indicated by arrow 550. As can be clearly seen in FIG. 4, the main amplifier die 442 and the peaking amplifier die 452 are oriented in angularly-offset (e.g., perpendicular) directions, with respect to each other. This may be advantageous in that the offset orientation may reduce or substantially eliminate electromagnetic interference between the dies 442, 452 and/or wirebond arrays extending from the dies 442, 452. In an alternate embodiment, the main and peaking amplifier dies 442, 452 may be arranged in parallel with each other.

A shunt inductance circuit 461 may be connected to the output terminal 458 of the peaking amplifier die 452. More particularly, the RF output terminal 458 may be electrically coupled through a second shunt inductance circuit 461 to a landing pad 465. When integrated with a larger RF system, landing pad 465 may be connected to system ground. The second shunt inductance circuit 461 includes an inductive element in the form of a set of wirebonds (not numbered) and a capacitor 463, where the inductive element and the capacitor 463 are connected in series between the RF output terminal 458 and the landing pad 465. According to an embodiment, the wirebonds are configured to provide an inductance that is sufficient to resonate out at least some of the drain-source capacitance of transistor 457. The shunt capacitor 463 has a capacitance value that is chosen to provide a virtual ground reference voltage for the RF electrical signals, such that the wirebonds function as a shunt inductance to the RF ground voltage. Desirably, the shunt capacitor 463 is series resonant in band.

The conductive trace to which the wirebonds and capacitor 463 are coupled corresponds to an RF cold point node, and accordingly the trace may be used to provide a DC bias voltage to the drain of the final-stage transistor 457 through output terminal 458. Accordingly, in an embodiment, the trace also may be coupled through the substrate 440 to landing pad 467. Landing pad 467, in turn, may be coupled to a drain bias circuit in the RF system to which module 400 ultimately is connected.

The RF output terminal 458 of peaking amplifier die 452 includes an elongated first pad that is configured to enable wirebonds of a first wirebond array (e.g., the wirebond array coupling the output terminal 458 to the inverter line 472) to be connected to the first pad so that the wirebonds extend in a direction that is angularly offset from (e.g., perpendicular to) the direction of the signal path through the peaking amplifier die 452 (e.g., the wirebonds may extend parallel to the direction indicated by arrow 530). Further, the RF output terminal 458 may include an elongated second pad that is configured to enable the wirebonds of a second wirebond array 459 to be connected to the second pad so that the wirebonds extend in a direction that is substantially parallel to the direction of the signal path through the peaking amplifier die 452 (i.e., wirebonds 459 may extend in the direction indicated by arrow 550). Further still, the RF output terminal 458 of peaking amplifier die 452 may include an elongated third pad that is configured to enable wirebonds of a third wirebond array (e.g., the wirebond array in the shunt inductance circuit 461) to be connected to the third pad so that the wirebonds extend in a direction that is angularly offset from (e.g., perpendicular to) the direction of the signal path through the peaking amplifier die 452 (e.g., the wirebonds may extend in a direction that is parallel to, but 180 degrees offset from the direction indicated by arrow 530).

According to an embodiment, except for the configurations of the RF output terminals 448, 458, the peaking amplifier die 452 may be structurally identical to the main amplifier die 442, meaning that the two dies 442, 452 include the same structural and electrical elements arranged and interconnected in the same manner. According to a further embodiment, the peaking amplifier die 452 and the main amplifier die 442 are identical in size, characterizing the Doherty amplifier module 400 as a symmetric Doherty amplifier. In an alternate embodiment, the peaking amplifier die 452 and the main amplifier die 442 may have different sizes, characterizing the Doherty amplifier module 400 as an asymmetric Doherty amplifier. For example, the peaking amplifier die 452 may be larger than the main amplifier die 442 by a ratio (e.g., 1.6:1, 2:1, or some other ratio). As discussed previously, the symmetry or asymmetry (and the degree of asymmetry) of the main and peaking amplifier dies 442, 452 determine the relative percentage of power in the main and peaking signals produced at the outputs 432, 433 of the signal splitter 410.

As mentioned above, through a wirebond array (not numbered), the RF output terminal 458 is electrically coupled to inverter line 472. Accordingly, the amplified main signal produced by the main amplifier die 442 is received at the RF output terminal 458 of the peaking amplifier die 452 through the series combination of a first wirebond array coupled to the output terminal 448 of die 442, inverter line 472, and a second wirebond array coupled to the inverter line 472. The amplified peaking signal produced by the peaking amplifier die 452 also is received at the RF output terminal 458, and the module 400 is configured so that the amplified main and peaking signals arrive and are combined at output terminal 458 (also referred to as a combining node 480) in phase with each other.

According to an embodiment, the RF output terminal 458 (and combining node 480) is electrically coupled to conductive output line 490 at the mounting surface 441 with wirebond array 459. As illustrated in FIG. 4, the wirebonds of the wirebond array 459 are aligned in the same direction as the RF signal path through the peaking amplifier die 452 (e.g., in the direction indicated by arrow 550). An output impedance matching network 492 and/or a decoupling (or DC Blocking) capacitor 494 may be coupled along output line 490, in an embodiment. The output impedance matching network 492 functions to present the proper load impedance to combining node 480. Although the detail is not shown in FIG. 4, the output impedance matching network 492 may include various discrete and/or integrated components (e.g., capacitors, inductors, and/or resistors) to provide the desired impedance matching. The output impedance matching network 492 is electrically coupled through the substrate 440 to conductive landing pad 496 exposed at the land surface. The landing pad 496 functions as the RF output terminal for the Doherty amplifier module 400.

Besides the bias circuitry connections previously discussed, module 400 also may include additional bias circuitry and/or bias circuitry connections configured to provide gate and drain bias voltages to some or all of the driver and output transistors 445, 455, 447, 457. For example, the bias circuitry may include, among other things, a plurality of landing pads (at the land surface of the substrate 440), contacts (at the mounting surface 441 of the substrate 440), and other conductive structures and circuitry. Bias voltages provided to the gates and/or drains of the transistors 445, 455, 447, 457 facilitate Doherty operation of the module. For example, the transistors 445, 447 of the main amplifier die 442 may be biased to operate in class AB mode, and the transistors 455, 457 of the peaking amplifier die 452 may be biased to operate in class C mode. The above-described configuration corresponds to a non-inverted Doherty amplifier. In an alternate embodiment, modifications could be made to configure the module 400 to function as an inverted Doherty amplifier.

Figure 5:
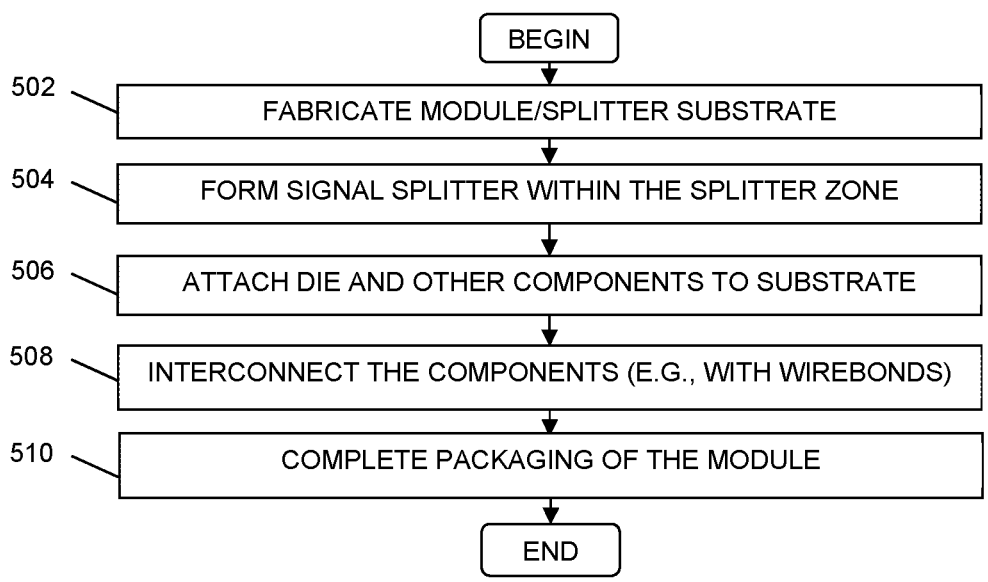
FIG. 5 is a flowchart of a method for fabricating a Doherty amplifier module, in accordance with an example embodiment.

FIG. 5 is a flowchart of a method for fabricating a power splitter (e.g., power splitter 100, 200, 410, FIGS. 1-4), and an amplifier module (e.g., Doherty amplifier module 400, FIG. 4), in accordance with an example embodiment.

The method begins, in block 502, by fabricating a substrate (e.g., substrate 240, 440, FIGS. 2-4), which includes a plurality of conductive features (e.g., landing pads, contacts, conductive traces, and conductive vias) arranged to provide desired electrical connectivity to subsequently attached discrete die and components. As discussed previously, a plurality of non-overlapping zones (e.g., zones 401-405, FIG. 4) may be defined at the mounting surface (e.g., surface 241, 441, FIGS. 2-4) of the substrate. Within die mounting zones (e.g., zones 402, 403, FIG. 4), the substrate may include conductive heat-sink features (e.g., conductive trenches or a conductive coin, for example). In addition, in an embodiment, the substrate may include one or more transmission line elements (e.g., phase shift and impedance inversion element 472, FIG. 4), with physical and electrical lengths configured as described in detail above.

In block 504, a signal splitter (e.g., signal splitter 100, 200, 410, FIGS. 1-4) is formed in the signal splitter zone (e.g., zone 401, FIG. 4). For example, the signal splitter may be formed by coupling discrete, surface mount components (e.g., components 214, 217, 220, 223, 226, 229, 414, 417, 420, 423, 426, 429, FIGS. 2-4) corresponding to the passive elements of the signal splitter to bond pads (e.g., bond pads 202-211, FIG. 2) at the mounting surface of the substrate. In an alternate embodiment, as indicated previously, the signal splitter may be implemented using a substrate (e.g., a small PCB, semiconductor substrate, or ceramic substrate) that is distinct from the module substrate. In such an embodiment, the splitter substrate (with its associated splitter components) may be coupled to the module substrate with in the signal splitter zone (e.g., zone 401, FIG. 4).

Additional processes are performed to complete the amplifier module. For example, in block 506, first and second amplifier die (e.g., main and peaking amplifier die 442, 452, FIG. 4) are attached to the mounting surface of the substrate in the die mounting zones, and other discrete components also are attached to the mounting surface of the substrate. In block 508, the various components are electrically connected together with wirebonds and/or other conductive coupling means. Finally, in block 510, the various die and components overlying the mounting surface of the substrate are encapsulated (e.g., with encapsulant material 330, FIG. 3), or otherwise contained (e.g., in an air cavity package configuration) to complete the module.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power splitter comprising:
    a substrate;
    an input terminal coupled to the substrate and configured to receive an input radio frequency (RF) signal;
    a first output terminal coupled to the substrate and configured to produce a first RF output signal;
    a second output terminal coupled to the substrate and configured to produce a second RF output signal;
    a first capacitance coupled to the substrate and directly electrically coupled, without additional intervening components, between the input terminal and the first output terminal;
    a second capacitance coupled to the substrate and directly electrically coupled, without additional intervening components, between the input terminal and the second output terminal;
    a first inductance coupled to the substrate and directly electrically coupled, without additional intervening components, between the input terminal and a ground reference node;
    a second inductance coupled to the substrate and directly electrically coupled, without additional intervening components, between the first output terminal and the ground reference node;
    a third inductance coupled to the substrate and directly electrically coupled, without additional intervening components, between the second output terminal and the ground reference node; and
    a resistance coupled to the substrate and directly electrically coupled, without additional intervening components, between the first and second output terminals,
    wherein the first and second capacitance, the first, second, and third inductance, and the resistance are discrete, surface mount components.

2. The power splitter of claim 1, wherein the substrate is selected from a printed circuit board, a semiconductor substrate, and a ceramic substrate.

3. A radio frequency (RF) power amplifier module comprising:
    a module substrate having a mounting surface, wherein a plurality of non-overlapping zones is defined at the mounting surface;
    a signal splitter coupled to the mounting surface in a first zone of the plurality of non-overlapping zones, wherein the signal splitter includes
        a splitter input terminal configured to receive an input RF signal,
        a first splitter output terminal configured to produce a first RF output signal,
        a second splitter output terminal configured to produce a second RF output signal,
        a first capacitance directly electrically coupled, without additional intervening components, between the splitter input terminal and the first splitter output terminal,
        a second capacitance directly electrically coupled, without additional intervening components, between the splitter input terminal and the second splitter output terminal,
        a first inductance directly electrically coupled, without additional intervening components, between the splitter input terminal and a ground reference node,
        a second inductance directly electrically coupled, without additional intervening components, between the first splitter output terminal and the ground reference node,
        a third inductance directly electrically coupled, without additional intervening components, between the second splitter output terminal and the ground reference node, and
        a resistance directly electrically coupled, without additional intervening components, between the first and second splitter output terminals,
        wherein the first and second capacitance, the first, second, and third inductance, and the resistance are discrete, surface mount components that are directly connected to bond pads at the mounting surface of the module substrate;
    a first power transistor die coupled to the mounting surface in a second zone of the plurality of non-overlapping zones, wherein the first power transistor die includes a first transistor integrated within the first power transistor die, and wherein an input terminal of the first power transistor die is electrically coupled to the first splitter output terminal; and
    a second power transistor die coupled to the mounting surface in a third zone of the plurality of non-overlapping zones, wherein the second power transistor die includes a second transistor integrated within the second power transistor die, and wherein an input terminal of the second power transistor die is electrically coupled to the second splitter output terminal.

4. The RF power amplifier module of claim 3, wherein the signal splitter further comprises:

a splitter substrate that is distinct from the module substrate, wherein the first and second capacitance, the first, second, and third inductance, and the resistance are discrete, surface mount components that are directly connected to bond pads at a surface of the splitter substrate, and the splitter substrate is coupled to the mounting surface of the module substrate.

5. The RF power amplifier module of claim 3, further comprising:
an input circuit electrically coupled between the second splitter output terminal and the input terminal of the second power transistor die, wherein the input circuit is configured to impart a 90-degree phase shift to the second RF output signal provided at the second splitter output terminal.

6. The RF power amplifier module of claim 3, further comprising:
a first transmission line coupled to the substrate and located within a fourth zone of the plurality of non-overlapping zones, wherein a first end of the first transmission line is coupled to an output terminal of the first power transistor die, and a second end of the first transmission line is coupled to an output terminal of the second power transistor die.

7. The RF power amplifier module of claim 6, further comprising:
a second transmission line coupled to the substrate and located within a fifth zone of the plurality of non-overlapping zones, wherein the second transmission line is coupled to the output terminal of the second power transistor die.

8. The amplifier module of claim 3, wherein the first power transistor die is a main amplifier die of a Doherty power amplifier, and the second power transistor die is a peaking amplifier die of a Doherty power amplifier.

9. A Doherty amplifier comprising:
a module substrate having a mounting surface;
a signal splitter coupled to the mounting surface of the module substrate, wherein the signal splitter includes
a splitter input terminal configured to receive an input RF signal,
a first splitter output terminal configured to produce a first RF output signal,
a second splitter output terminal configured to produce a second RF output signal,
a first capacitance directly electrically coupled, without additional intervening components, between the splitter input terminal and the first splitter output terminal,
a second capacitance directly electrically coupled, without additional intervening components, between the splitter input terminal and the second splitter output terminal,
a first inductance directly electrically coupled, without additional intervening components, between the splitter input terminal and a ground reference node,
a second inductance directly electrically coupled, without additional intervening components, between the first splitter output terminal and the ground reference node,
a third inductance directly electrically coupled, without additional intervening components, between the second splitter output terminal and the ground reference node, and
a resistance directly electrically coupled, without additional intervening components, between the first and second splitter output terminals,
wherein the first and second capacitance, the first, second, and third inductance, and the resistance are discrete, surface mount components;
a main amplifier coupled to the mounting surface of the module substrate, wherein the main amplifier includes a main amplifier input terminal and a main amplifier output terminal, wherein the main amplifier input terminal is electrically coupled to the first splitter output terminal; and
a peaking amplifier coupled to the mounting surface of the module substrate, wherein the peaking amplifier includes a peaking amplifier input terminal and a peaking amplifier output terminal, wherein the peaking amplifier input terminal is electrically coupled to the second splitter output terminal.

10. The Doherty amplifier of claim 9, wherein the first and second capacitance, the first, second, and third inductance, and the resistance are directly connected to bond pads at the mounting surface of the module substrate.

11. The Doherty amplifier of claim 9, further comprising:
an input circuit electrically coupled between the second splitter output terminal and the peaking amplifier input terminal, wherein the input circuit is configured to impart a 90-degree phase shift to the second RF output signal provided at the second splitter output terminal.

12. The Doherty amplifier of claim 9, further comprising:
a phase shift and impedance inversion structure connected between the first drain terminal and the second drain terminal, wherein the phase shift and impedance inversion structure includes a transmission line with a first end coupled to the main amplifier output terminal, and a second end coupled to the peaking amplifier output terminal.

13. The Doherty amplifier of claim 9, wherein the signal splitter further comprises:
a splitter substrate that is distinct from the module substrate; and
a plurality of bond pads at a surface of the splitter substrate, wherein the first and second capacitance, the first, second, and third inductance, and the resistance are connected to the plurality of bondpads.

14. The Doherty amplifier of claim 9, wherein the module substrate comprises:
a plurality of bond pads at the mounting surface of the module substrate, wherein the first and second capacitance, the first, second, and third inductance, and the resistance are connected to the plurality of bondpads.

15. The power splitter of claim 1, wherein the substrate comprises a multi-layer printed circuit board that includes:
a plurality of bond pads at a top surface of the multi-layer printed circuit board, wherein the first and second capacitance, the first, second, and third inductance, and the resistance are connected to the plurality of bond pads; and
a plurality of lands at a bottom surface of the multi-layer printed circuit board, wherein the plurality of lands includes a first land corresponding to the input terminal, a second land comprising the first output terminal, and a third land corresponding to the second output terminal.

* * * * *